US 12,128,652 B2

(12) United States Patent
Feng et al.

(10) Patent No.: US 12,128,652 B2
(45) Date of Patent: Oct. 29, 2024

(54) CERAMIC PACKAGE FOR QUANTUM COMPUTING AND METHOD FOR PREPARATION

(71) Applicant: HEFEI SHENGDA ELECTRONICS TECHNOLOGY INDUSTRY CO., LTD., Anhui (CN)

(72) Inventors: Dong Feng, Hefei (CN); Lili Jia, Hefei (CN); Lei Yang, Hefei (CN); Chunlei Geng, Hefei (CN); Yujun Zhang, Hefei (CN)

(73) Assignee: HEFEI SHENGDA ELECTRONICS TECHNOLOGY INDUSTRY CO., LTD., Hefei (CN)

( * ) Notice: Subject to any disclaimer, the term of this patent is extended or adjusted under 35 U.S.C. 154(b) by 0 days.

(21) Appl. No.: 18/602,004

(22) Filed: Mar. 11, 2024

(65) Prior Publication Data
US 2024/0300219 A1 Sep. 12, 2024

(30) Foreign Application Priority Data
Mar. 10, 2023 (CN) .......................... 202310247976.8

(51) Int. Cl.
*B32B 18/00* (2006.01)
*B32B 3/14* (2006.01)
(Continued)

(52) U.S. Cl.
CPC ............... *B32B 18/00* (2013.01); *B32B 3/14* (2013.01); *B32B 3/266* (2013.01); *B32B 37/06* (2013.01);
(Continued)

(58) Field of Classification Search
CPC ....... C04B 37/003; C04B 41/52; C04B 41/55; C04B 41/89; C04B 2237/125;
(Continued)

(56) References Cited

FOREIGN PATENT DOCUMENTS

| CN | 107564868 A | 1/2018 |
|---|---|---|
| CN | 111367028 A | 7/2020 |

(Continued)

OTHER PUBLICATIONS

FIT translation to English for CN 114023733 A via Search, accessed May 6, 2024 (Year: 2022).*

(Continued)

*Primary Examiner* — Nancy R Johnson
(74) *Attorney, Agent, or Firm* — PORUS IP LLC

(57) ABSTRACT

The present disclosure provides a ceramic package for quantum computing and a method for preparation. The ceramic package for quantum computing may include a first ceramic plate, a vacuum tube, and a second ceramic plate connected sequentially from bottom to top, wherein the first ceramic plate is installed with a first light window, the second ceramic plate is installed with a second light window, the first light window and the second light window cover a signal inlet and a signal outlet of the vacuum tube, respectively; the first ceramic plate is provided with a lead wire on a side depart from the vacuum tube and configured to lead a signal into a system. The method for preparation may include placing the first ceramic plate, the vacuum tube, the second ceramic plate, the lead wire, and the first solder sheet in a mold for positioning, and soldering the solder sheet into a sintered member by heating and melting the solder sheet; plating nickel and gold on an outer surface of the sintered member, respectively; providing a gold layer on a welding surface of the light window and a plating layer on a photon signal passage; and soldering a gold-plated sintered member to the first light window and the second light window with gold and tin through the second solder sheet, respectively, to form a ceramic package with a vacuum channel.

5 Claims, 7 Drawing Sheets

(51) Int. Cl.
 *B32B 3/26* (2006.01)
 *B32B 37/06* (2006.01)
 *C04B 37/04* (2006.01)

(52) U.S. Cl.
 CPC ...... *C04B 37/045* (2013.01); *B32B 2255/205* (2013.01); *B32B 2311/04* (2013.01); *B32B 2315/02* (2013.01); *B32B 2457/00* (2013.01); *C04B 2237/125* (2013.01); *C04B 2237/366* (2013.01); *C04B 2237/62* (2013.01); *C04B 2237/68* (2013.01); *C04B 2237/765* (2013.01)

(58) Field of Classification Search
 CPC .......... C04B 2237/366; C04B 2237/62; C04B 2237/68; C04B 2237/765; C04B 37/006; Y02D 10/00; B32B 18/00; B32B 3/14; B32B 3/266; B32B 37/06; B32B 2255/205; B32B 2311/04; B32B 2315/02; B32B 2457/00
 See application file for complete search history.

(56) References Cited

FOREIGN PATENT DOCUMENTS

| | | | | |
|---|---|---|---|---|
| CN | 213782007 U | | 7/2021 | |
| CN | 214226917 U | | 9/2021 | |
| CN | 113727543 A | | 11/2021 | |
| CN | 114023733 A | * | 2/2022 | |
| CN | 216980538 U | | 7/2022 | |
| CN | 115280610 A | * | 11/2022 | ........... H01S 5/0064 |
| CN | 115547939 A | * | 12/2022 | |
| FR | 1305115 A | | 9/1962 | |
| WO | 9956316 A1 | | 11/1999 | |
| WO | WO-2018231212 A1 | * | 12/2018 | |
| WO | 2021227240 A1 | | 11/2021 | |

OTHER PUBLICATIONS

FIT translation to English for CN 115280610 A via Search, accessed May 6, 2024 (Year: 2022).*
FIT translation to English for CN 115547939 A via Search, accessed May 6, 2024 (Year: 2022).*
First Office Action in Chinese Application No. 202310247976.8 mailed on Dec. 18, 2023, 12 pages.
Notification to Grant Patent Right for Invention in Chinese Application No. 202310247976.8 mailed on Feb. 1, 2024, 5 pages.

* cited by examiner

CERAMIC PACKAGE FOR QUANTUM COMPUTING AND METHOD FOR PREPARATION

CROSS-REFERENCE TO RELATED APPLICATIONS

The application claims priority of the Chinese Patent Application No. 202310247976.8, filed on Mar. 10, 2023, the entire content of which are hereby incorporated by reference

TECHNICAL FIELD

The present disclosure relates to a field of quantum computer packaging, and in particular to a ceramic package for quantum computing and a method for preparation.

BACKGROUND

A quantum technology is one of the important development directions in a field of information in the future. The quantum of light (referred to as photons) may be transmitted into the system as signals, and the signals may be received, processed, and transmitted by internal elements. A package, as a carrier of the internal elements, may directly determine structures of the internal elements, working efficiency, layout mode within the system, heat dissipation mode, or the like.

The current system for processing quantum signals of light may be composed of multiple single-function modules arranged in a flat layout on a system board, and connected with each other through assembly lines, which inevitably leads to issues such as occupying a large space, long signal transmission paths, and low assembly density. Moreover, since the modules often use alumina ceramic package or plastic package, the heat dissipation for the package may be usually poor.

Therefore, it is necessary to propose a lightweight, highly heat-dissipative ceramic package for quantum computing, capable of transmitting high-quality light source signals in a low-vacuum environment.

SUMMARY

One or more embodiments of the present disclosure provide a ceramic package for quantum computing, the ceramic package may include: a first ceramic plate, a vacuum tube, and a second ceramic plate connected sequentially from bottom to top, wherein the first ceramic plate may be installed with a first light window, the second ceramic plate may be installed with a second light window, the first light window and the second light window may cover a signal inlet and a signal outlet of the vacuum tube, respectively; the first ceramic plate may be provided with a lead wire arranged on a side depart from the vacuum tube and configured to lead a signal into a system; the first ceramic plate may be provided with a first through hole in a middle of the first ceramic plate, the second ceramic plate may be provided with a second through hole in a middle of the second ceramic plate, the first light window may cover the first through hole, the second light window may cover the second through hole, the first through hole, the vacuum tube, and the second through hole may be coaxially arranged; the vacuum tube and the first ceramic plate may be connected by a first solder sheet, and the vacuum tube and the second ceramic plate may be connected by the first solder sheet; the first light window and the first through hole may be connected by a second solder sheet, and the second light window and the second through hole may be connected by the second solder; the first ceramic plate and the second ceramic plate may be both aluminum nitride ceramic plates; the first solder sheet may be a silver-copper solder sheet and the second solder sheet may be a gold-tin solder sheet; and a size of the first ceramic plate may be larger than a size of the second ceramic plate.

One or more embodiments of the present disclosure provide a method for preparing a ceramic package for quantum computing of claim 1, comprising:
  in S1, placing the first ceramic plate, the vacuum tube, the second ceramic plate, the lead wire, and the first solder sheet in a mold for positioning, and soldering the solder sheet into a sintered member by heating and melting the solder sheet;
  in S2, plating nickel and gold on an outer surface of the sintered member, respectively;
  in S3, providing a gold layer on a welding surface of the light window and a plating layer on a photon signal passage; and
  in S4, connecting a gold-plated sintered member with the first light window and the second light window through gold-tin soldering by the second solder sheet, respectively, to form a ceramic package with a vacuum channel.

BRIEF DESCRIPTION OF THE DRAWINGS

The present disclosure will be further illustrated by way of exemplary embodiments, which will be described in detail with the accompanying drawings. These embodiments are non-limiting. In these embodiments, the same count indicates the same structure, wherein.

DETAILED DESCRIPTION

Figure 1:
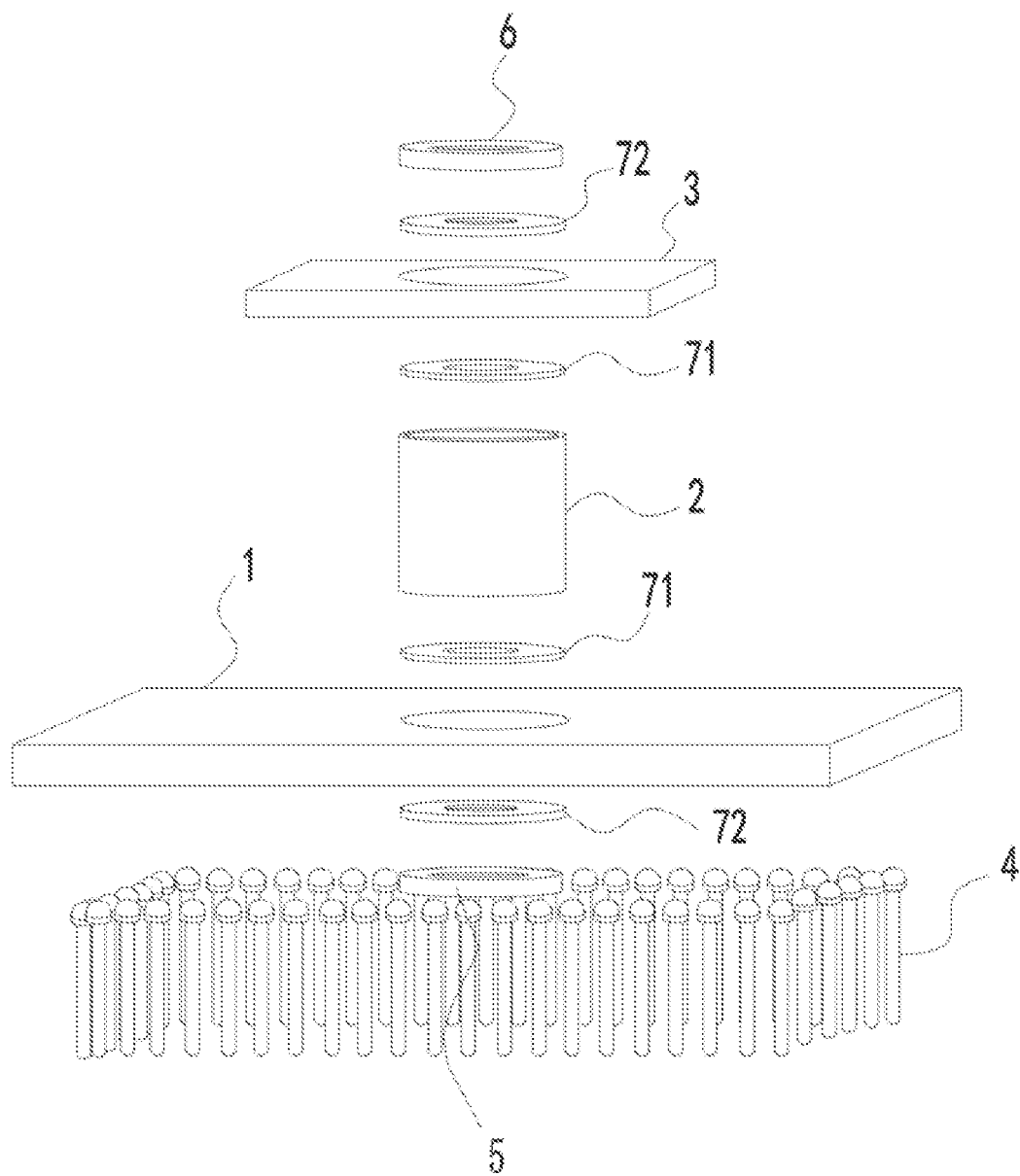
FIG. 1 is a schematic diagram illustrating a structure of a ceramic package for quantum computing according to some embodiments of the present disclosure.

In order to more clearly illustrate the technical solutions of the embodiments of the present disclosure, the following briefly introduces the drawings that need to be used in the description of the embodiments. Apparently, the accompanying drawings in the following description are only some examples or embodiments of the present disclosure, and those skilled in the art can also apply the present disclosure to other similar scenarios according to the drawings without creative efforts. Unless obviously obtained from the context or the context illustrates otherwise, the same numeral in the drawings refers to the same structure or operation.

It should be understood that "system," "device," "unit," and/or "module" as used herein is a method for distinguishing different components, elements, parts, portions or assemblies of different levels. However, the words may be replaced by other expressions if other words can achieve the same purpose.

As indicated in the disclosure and claims, the terms "a," "an," and/or "the" are not specific to the singular form and may include the plural form unless the context clearly indicates an exception. Generally speaking, the terms "comprising" and "including" only suggest the inclusion of clearly identified steps and elements, and these steps and elements do not constitute an exclusive list, and the method or device may also contain other steps or elements.

Figure 2:
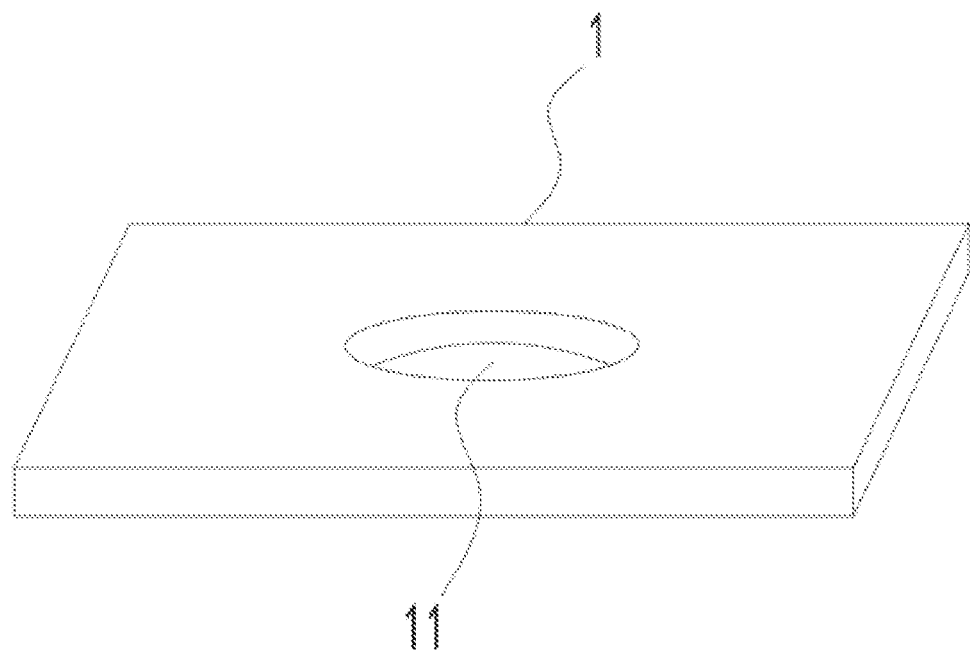
FIG. 2 is a schematic diagram illustrating a structure of a first ceramic plate according to some embodiments of the present disclosure.
Figure 3:
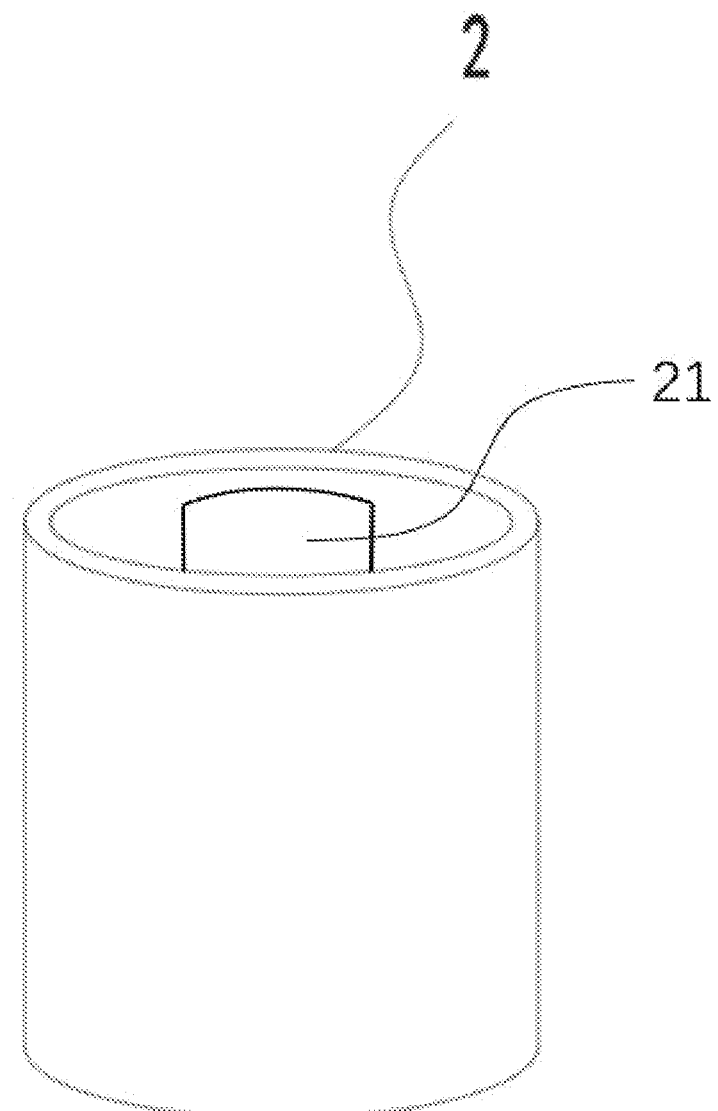
FIG. 3 is a schematic diagram illustrating a structure of a vacuum tube according to some embodiments of the present disclosure.
Figure 4:
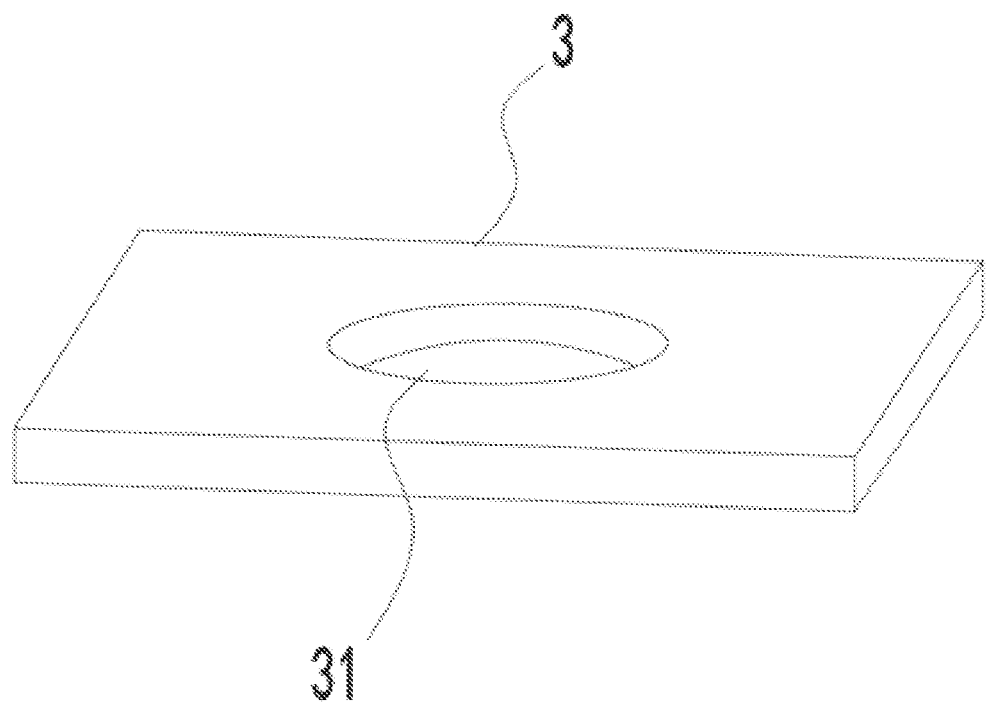
FIG. 4 is a schematic diagram illustrating a structure of a second ceramic plate according to some embodiments of the present disclosure.

FIG. 1 is a schematic diagram illustrating a structure of a ceramic package for quantum computing according to some embodiments of the present disclosure; FIG. 2 is a schematic diagram illustrating a structure of a first ceramic plate according to some embodiments of the present disclosure; FIG. 3 is a schematic diagram illustrating a structure of a vacuum tube according to some embodiments of the present disclosure; and FIG. 4 is a schematic diagram illustrating a structure of a second ceramic plate according to some embodiments of the present disclosure.

In some embodiments, as shown in FIG. 1, the ceramic package for quantum computing may include a first ceramic plate 1, a vacuum tube 2, and a second ceramic plate 3 connected sequentially from bottom to top, the first ceramic plate 1 is installed with a first light window 5, the second ceramic plate 3 is installed with a second light window 6, the first light window 5 and the second light window 6 cover a signal inlet and a signal outlet of the vacuum tube 2, respectively; the first ceramic plate 1 is provided with a lead wire on a side depart from the vacuum tube 2.

The first ceramic plate 1 may be configured to connect to a chip that receives and processes a light source signal.

The second ceramic plate 3 may be configured to amplify and/or transform a processed light source signal. In some embodiments, the second ceramic plate 3 may be insert connected with an electronic system (referred to as a system) via a surface of a lead wire 4.

In some embodiments, as shown in FIG. 2 and FIG. 4, the first ceramic plate 1 and the second ceramic plate 3 are in a shape of a plate. It should be noted that the first ceramic plate 1 and the second ceramic plate 3 in FIG. 1 are shown only as an illustration, which may be different from an actual shape. The actual shape of the first ceramic plate 1 and the second ceramic plate 3 may be set as desired.

In some embodiments, the first ceramic plate 1 may be connected with the second ceramic plate 3 via a soft row of wires, and the second ceramic plate 3 may transmit the signal to the first ceramic plate 1 via the soft row of wires.

In some embodiments, the size of the first ceramic plate 1 may be larger than the size of the second ceramic plate 3. For example, the first ceramic plate 1 may be 1.5 times of the second ceramic plate 3, which facilitates a pulling of the other end of the soft row of wires connected with the second ceramic plate 3 onto the first ceramic plate 1.

In some embodiments, the first ceramic plate 1 and the second ceramic plate 3 are aluminum nitride ceramic plates, which have advantages such as light weight (density 3.3 g/cm$^3$), high thermal conductivity (greater than 170 w/m·K), high strength, good matching with the chip, high reliability, or the like.

In some embodiments of the present disclosure, aluminum nitride with lightweight, high thermal conductivity, and high strength properties may be used, and the aluminum nitride ceramic plate may use interconnecting wires or interlayer through-hole filled conductor to form interconnection lines, which significantly shortens the signal transmission path, thereby improving the operational efficiency of the elements. Through a structural optimization of the dual aluminum nitride ceramic plate, a dimension of the ceramic package can be reduced, resulting in a decrease of the heat dissipation volume.

The vacuum tube 2 may be configured to connect the first ceramic plate 1 and the second ceramic plate 2 and form an intermediate channel for light source transmission. As shown in FIG. 1 and FIG. 3, the vacuum tube 2 may include a signal inlet and a signal outlet, and the light source signal may be input from the signal inlet, pass through the vacuum tube 2, and output from the signal outlet.

It should be noted that the vacuum tube 2 in FIG. 1 and FIG. 3 is for illustration purposes only, which may be different from an actual shape. The actual shape of the vacuum tube 2 may be customized as needed.

In some embodiments, the vacuum tube 2 may be a copper-based vacuum tube. The copper-based vacuum tube has less stress and are less prone compared to vacuum tubes made of other materials.

In some embodiments of the present disclosure, two ceramic plates with different functions may be connected through the copper-based vacuum tube to form an intermediate channel of the light source transmission, which enhances compatibility of the package and avoids problems such as high stress and easy cracking caused by the use of the vacuum tubes made of other materials, resulting in greatly improving the reliability of the product. Additionally, the use of the vacuum tube between the two ceramic plates may result in low internal air pressure, which facilitates the internal transmission of photons.

The first light window 5 and the second light window 6 may be configured to isolate the vacuum tube 2 from an outside and act as a filter for light waves with different wavelengths. Common light windows may include zinc selenide (ZnSe) and germanium (Ge) window sheets for an infrared spectral band, fused silica and sapphire window sheets for an ultraviolet spectral band, and K9 window sheets for a visible spectral band, or the like.

It should be noted that the first light window 5 and the second light window 6 in FIG. 1 are for illustration only, which may be different from an actual shape. The actual shapes of the first light window 5 and the second light window 6 may be set as required.

In some embodiments of the present disclosure, by isolating the vacuum tube with the first light window and the second light window, the vacuum tube may be protected; and by selecting a suitable first light window and second light window, interfering signals with other wavelengths may be attenuated and the quality of light source signal transmission may be improved.

Figure 5:
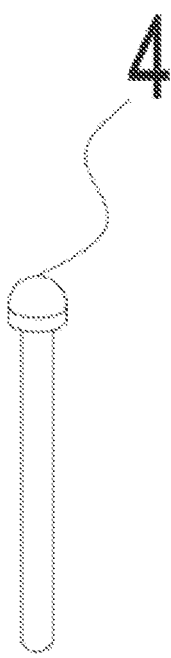
FIG. 5 is a schematic diagram illustrating a structure of a lead wire according to some embodiments of the present disclosure.
Figure 6:
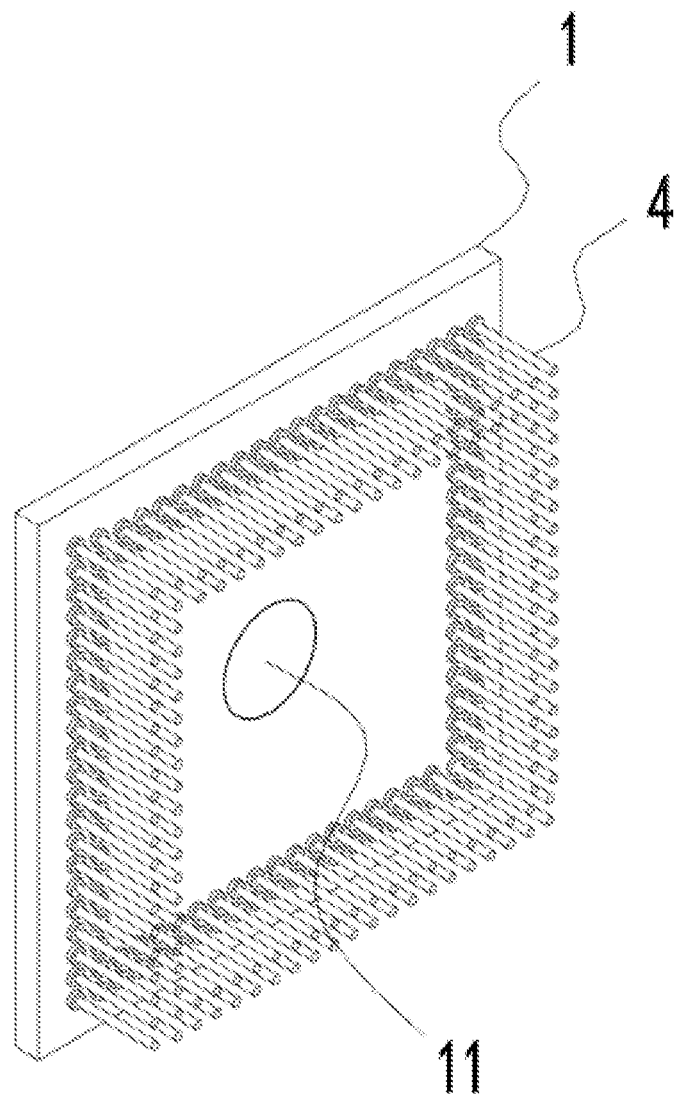
FIG. 6 is a schematic diagram illustrating a structure of a localized shape of a ceramic package after a lead wire is installed according to some embodiments of the present disclosure.

FIG. 5 is a schematic diagram illustrating a structure of a lead wire according to some embodiments of the present disclosure; and FIG. 6 is a schematic diagram illustrating a structure of a localized shape of the enclosure after a lead wire is installed according to some embodiments of the present disclosure.

The lead wire 4 may be configured to connect the first ceramic plate 1 with the system. In some embodiments, a chip on the first ceramic plate 1 may transmit the processed signal to the system via the lead wire 4. The structure of the lead wire 4 may be shown in FIG. 5. The localized shape of the ceramic package for quantum computing after the lead wire 4 is installed 4 may be shown in FIG. 6.

The ceramic package for quantum computing may be soldered with conventional silver-copper soldering and vacuum gold-tin soldering, respectively, which may depend on the characteristics of accessories. The embodiments of the present disclosure do not emphasize a wiring of the ceramic plate and specific process parameters, but mainly explain a structure of the package, roles of each accessory, functions of the ceramic plate, and signal processing path.

In some embodiments, as shown in FIG. 1-FIG. 4, a first through hole 11 is provided in a middle of the first ceramic plate 1, and a second through hole 31 is provided in a middle of the second ceramic plate 3, and the first light window 5 covers the first through hole 11, and the second light window 6 covers the second through hole 31, and the first through hole 11, the vacuum tube 2, and the second through hole 31 are coaxially arranged.

It should be noted that the first through hole 11 in FIG. 2 and the second through hole 13 in FIG. 4 are used for illustration only, which may be different from an actual shape. The actual shapes of the first through hole 11 and the second through hole 13 may be set according to the actual shape of the vacuum tube 2.

In some embodiments, a size of the first through hole 11 may be slightly larger than a size of the vacuum tube 2, and a size of the second through hole 31 may be slightly larger than the size of the vacuum tube 2.

In some embodiments of the present disclosure, an installation position of the vacuum tube may be restricted by the first through hole and the second through hole, which may make the light source transmission channel more stable and improve a quality of the light source signal transmission.

Figure 7:
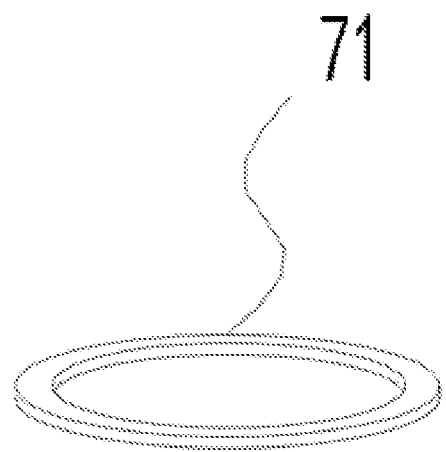
FIG. 7 is a schematic diagram illustrating a structure of a first solder sheet according to some embodiments of the present disclosure.

FIG. 7 is a schematic diagram illustrating a structure of a first solder sheet according to some embodiments of the present disclosure.

In some embodiments, as shown in FIG. 1, a vacuum tube 2 and a first ceramic plate 1 are connected by a first solder sheet 71, and the vacuum tube 2 and a second ceramic plate 3 are connected by the first solder sheet 71; a first light window 5 and a first through hole 11 are connected by a second solder sheet 72, and a second light window 6 and the second through hole 31 are connected by the second solder 72.

The solder sheet may be used as soldering material in a soldering process. The common solder sheet may include a copper solder sheet, a silver solder sheet, a tinned solder sheet, or the like. In some embodiments, the first solder sheet 71 may be a silver-copper solder sheet, and the second solder sheet 72 may be a gold-tin solder sheet.

It should be noted that the first solder sheet 71 and the second solder sheet 72 in FIG. 1 and FIG. 7 are for illustration purposes only, which may be different from an actual situation. The actual shapes, sizes, and thicknesses of the first solder sheet 71 and the second solder sheet 72 may be set as desired.

In some embodiments, an outer surface of the ceramic package for quantum computing is also plated with a nickel layer and a gold layer in sequence. Due to the subsequent assembly and installation requirements of the ceramic package for quantum computing, such as bonding and subsequent welding, all metalized layer patterns and metal parts surfaces of the package are plated with nickel and gold sequentially.

In some embodiments, the first light window 5 and the second light window 6 are connected with the ceramic plate through gold-tin soldering. The welding surfaces of the first light window 5 and the second light window 6 are plated with a gold layer, facilitating good wetting with the solder material. In some embodiments, the gold layer on the welding surfaces of the first light window 5 and the second light window 6 may be formed by manners such as lasing.

In some embodiments, a center region of the first light window 5 and the second light window 6 are provided with a plating layer for filtering out unwanted noise in the photonic signal. In some embodiments, the vacuum tube 2 may be connected with the first ceramic plate 1, and the vacuum tube 2 may be connected with the second ceramic plate 3 by the first solder sheet 71, and the first solder sheet 71 is a silver-copper solder sheet. In some embodiments, the surfaces of the first light window and the first light window are provided with a plating layer, a type and thickness of the plating layer is related to nature of the incident light source (e.g., wavelength), which may ensure the sealing of the solder after condensation.

In some embodiments of the present disclosure, by plating nickel and gold on the outer surface of the ceramic package for quantum computing, the assembly difficulty may be reduced; and by plating the welding surfaces of the first light window and the second light window with gold by using a gold tin solder sheet, the welding effect may be improved; by arranging a plating layer on the surfaces of the first light window and the second light window, the unwanted noise in the photonic signal may be filtered, which may ensure the sealing of the solder after condensation.

In some embodiments of the present disclosure, a main structure of the ceramic package for quantum computing composed of the vacuum tube and two aluminum nitride ceramic plates with different functions allows the ceramic package to utilize a light source as an input signal, receive and process the light source under low vacuum transmission conditions, which has advantages such as lightweight, fast heat dissipation, low vacuum transmission of high-quality light source signals, matching with the chip, and high reliability.

The present disclosure further provides a method for preparing a ceramic package for quantum computing, comprising:

in S1, the first ceramic plate, the vacuum tube, the second ceramic plate, the lead wire, and the first solder sheet may be placed in a mold for positioning, and the solder sheet may be soldered into a sintered member by heating and melting the solder sheet;

in S2, nickel and gold may be plated on an outer surface of the sintered member, respectively;

in S3, a gold layer on a welding surface of the light window and a plating layer may be provided on a photon signal passage; and in S4, a gold-plated sintered member may be connected with the first light window and the second light window through gold-tin soldering by the second solder sheet, respectively, to form a ceramic package with a vacuum channel.

In some embodiments, operation S4 may be accomplished in a vacuum furnace.

A vacuum furnace is a device that creates a low vacuum environment in the furnace chamber for heating. For example, the vacuum furnace may include a vacuum resistance furnace, a vacuum induction furnace, and a vacuum arc furnace.

In some embodiments, the vacuum degree within the vacuum channel in the operation S4 is less than 100 Pa.

The vacuum degree represents a parameter used to measure a degree of vacuum within a vacuum channel. In some embodiments, a staff member may measure a pressure in the vacuum channel, and obtain the vacuum degree within the vacuum channel by consulting a vacuum degree conversion table.

In some embodiments, the first ceramic plate 1 and the second ceramic plate 3 are made by casting, stacking, punching, filling, leveling, sintering, and plating sequentially; the vacuum tube is made by lathe machining; and the solder sheet is punched by a mold.

In some embodiments of the present disclosure, the two aluminum nitride ceramic plates, the vacuum tube, prefabricated solder lead wire, and silver-copper solder pieces may use specialized molds for positioning, the sintered member may be formed by soldering through silver copper welding, and a surface of the sintered member may be plated with nickel and gold, which may ensure the quality of the light source entering the vacuum tube channel; additionally, low-vacuum furnace gold soldering is used to attach two light windows on the ceramic plates at both ends of the vacuum tube, which may ensure that the vacuum tube operates in a low vacuum state. The condition is conducive to signal transmission and helps to avoid signal distortion.

Currently, the package for processing optical signals may include a metal package and a ceramic package. However, most of the packages involve feeding signals into optical fibers through conduits for transmission. In contrast, the embodiments of the present disclosure pertain to a ceramic package structure utilizing light as the signal source, and the light may transmit within the ceramic package under a low-vacuum environment.

The process of the embodiments of the present disclosure, as illustrated in the accompanying drawings, is detailed below.

As shown in FIG. 1, the photon signal may enter the package through the first light window 5 from the bottom of the package, emit from the second light window 6 through the vacuum tube 2 to a dedicated position of the chip (not shown in the figure), the remaining parts of the chip undergo signal processing, and the processed signal is output and controlled by a control signal sent by another chip on the package, wherein the signal input manner on the chip is through bonding wire, i.e., the chip that sends out the control signal may transmit the signal to the second ceramic plate 3, the signal from the second ceramic plate 3 may be transferred to the first ceramic plate 1 using a flexible ribbon cable (not shown in the figure), after being processed by surface mounting elements and/or chips on the first ceramic plate 1, the signal may be finally transmitted to the system through lead wire 4 on the package.

Currently, single or multi-functional circuit products are planarly mounted on subsystem boards, which may require multiple circuit products to fulfill specific functions. In contrast, the embodiments of the present disclosure utilize a dual-layer aluminum nitride ceramic plate scheme, which may require only a single product to achieve the intended function.

Currently, planar mounting is generally used, resulting in long signal transmission paths inside and outside the circuit. The embodiments of the present disclosure transmit signals through ceramic internal interconnections, bonding wires, and soft rows of wires, which may greatly shorten the signal transmission path.

Compared to a current commonly used large planar mounting form, in the embodiments of the present disclosure, a single product may achieve a function that typically requires multiple conventional circuit products, further reducing the product size. Furthermore, a high thermal conductivity of aluminum nitride helps to avoid chip and other device failures caused by poor heat dissipation, allowing for further product size reduction through means such as increased chip integration.

In some embodiments, the ceramic package for quantum computing may also include a microprocessor (not shown in the figure), a light sensing unit (not shown in the figure), an energy supply unit (not shown in the figure), and a semiconductor refrigeration sheet (see, FIG. 3).

In certain embodiments, the microprocessor may be installed inside the vacuum tube 2 and communicatively connected with the energy supply unit for signal processing. In some embodiments, the microprocessor may be obtained through common embedded chip packages. For example, the microprocessor may be an Embedded Micro Processor Unit (MPU), Embedded Microcontroller Unit (MCU), Embedded Digital Signal Processor (EDSP), or the like.

In some embodiments, the microprocessor is configured to: acquire, via the light sensing unit, the light power at various times within the passage through the vacuum tube 2, and, in response to detecting that an average light power passing through the vacuum tube 2 during a preset time period exceeds a preset power threshold value, generate an electrical signal and transmit the electrical signal to the energy supply unit. The preset time period and the preset power threshold may be preset and written to the microprocessor.

The light sensing unit may be configured to obtain the light power within vacuum tube 2. In some embodiments, the light sensing unit may be an optical power meter, an optical power detection circuit, or the like.

The energy supply unit may be configured to supply power to the microprocessor and a semiconductor refrigeration sheet 21. In some embodiments, the energy supply unit may be a linear power supply chip, a switching power supply chip, or the like.

In some embodiments, the energy supply unit may be mechanically coupled to the semiconductor refrigeration sheet 21.

In some embodiments, the energy supply unit may be configured to supply power to the microprocessor; and, in response to receiving the electrical signal from the microprocessor, apply a current to the semiconductor refrigeration sheet 21.

In some embodiments, as shown in FIG. 3, the semiconductor refrigeration sheet 21 may be embedded in a sidewall of the vacuum tube 2 to cool an inner wall of the vacuum tube 2. The count of semiconductor refrigeration sheets 21 may be one or more. A plurality of semiconductor refrigeration sheets 21 may be disposed on the inner wall of the vacuum tube 2 in a variety of feasible ways, such as at intervals along a circumferential direction of the vacuum tube 2. In some embodiments, the semiconductor refrigeration sheet 21 may be fabricated based on a P-N junction, achieving refrigeration through the Peltier effect.

In some embodiments, the semiconductor refrigeration sheet may include a cold end for absorbing heat and a hot end for releasing heat. In this case, the cold end of the semiconductor refrigeration sheet may be located inside the vacuum tube 2, and the hot end may be located outside the vacuum tube 2.

When the light travels through air, the light may be scattered by collisions with gas molecules, which may weaken the energy of the light, the phenomenon may be known as Rayleigh scattering. A degree of Rayleigh scattering may be related to a density and temperature of gas. When a high optical power light continuously passes through the vacuum tube 2, the temperature of the medium (a small amount of gas molecules) inside the vacuum tube 2 may increase, leading to an increase in losses and noise in the propagation of light within the vacuum tube 2.

The present disclosure may be implemented by monitoring the optical power in the vacuum tube 2 and initiating the semiconductor refrigeration sheet 21 to cool down the inner wall of the vacuum tube 2 when the optical power is relatively high. Subsequently, through the heat transfer, the temperature of the medium in the internal space (a small number of gas molecules) is reduced, thereby decreasing the loss of light propagation in the vacuum tube 2 and enhancing the quality of the light source signal transmission. Additionally, an increase of the system temperature may lead to greater thermal noise of the electronic elements. Therefore, the thermal noise may be diminished by cooling down the entire system.

In some embodiments, a preset power threshold is related to dimensional parameters and the vacuum degree of the vacuum tube 2. The dimensional parameters of the vacuum tube 2 may include a cross-sectional radius, a length, or the like.

In certain embodiments, an operator may preset a preset power threshold based on the dimensions and the vacuum degree of the vacuum tube 2. Understandably, the larger the dimension of the vacuum tube 2 and the higher the vacuum degree, the sparser gas molecules in the vacuum tube 2, resulting in less interference with the light. In such cases, the preset power threshold may be set relatively large. In some embodiments, the operator may determine the preset power threshold by consulting a first preset table based on the dimensional parameters and the vacuum degree of the vacuum tube 2. The first preset table may include the dimensional parameters and the vacuum degree of the vacuum tube 2, and the corresponding preset power threshold. The first preset table may be constructed based on experimental data.

In some embodiments, the microprocessor may be further configured to: calculate, based on optical powers obtained from the light sensing unit at a plurality of moments of passing through the vacuum tube 2, a statistical characteristic of the optical power of the light that passes through the vacuum tube 2; and, based on the statistical characteristic, send one of a plurality of the preset electrical signals to the energy supply unit, each electrical signal of the plurality of preset electrical signals having different signal characteristics, wherein the statistical characteristics may include an average value of the optical power and a variance of the optical power.

In some embodiments, the energy supply unit may be further configured to: in response to receiving the electrical signals from the microprocessor, apply a current to the semiconductor refrigeration sheet 21 in a current mode corresponding to the signal characteristic based on the received electrical signal.

The signal characteristics of the electrical signal may include a waveform (e.g., square wave, sawtooth wave, sine wave, etc.), an amplitude, a frequency, or a phase of the electrical signal. In some embodiments, each of the plurality of preset electrical signals may be distinguished by different preset signal characteristics.

In some embodiments, the microprocessor may determine, based on the statistical characteristic of the optical power of the light within the vacuum tube 2, which of the plurality of the preset electrical signals needs to be sent to the energy supply unit by querying a second preset table. The second preset table may include a correspondence between the statistical characteristic and the electrical signal. The second preset table may be constructed based on historical data or empirical knowledge and stored in the microprocessor.

A current mode refers to a case where the energy supply unit outputs the current. In some embodiments, the current mode may include a magnitude of an applied current and a duration of the applied current when the energy supply unit outputs a constant current. In some embodiments, when the current output from the energy supply unit varies, the current pattern may be a curve of the magnitude of the output current over time.

In some embodiments, each signal characteristic of the electrical signals may correspond to a current mode, and the correspondence between the signal characteristic and the current mode may be manually preset and stored in the microprocessor. In some embodiments, when the mean value of the optical power in the statistical feature is higher and the variance of the optical power is larger, there is a greater need to enhance the cooling effect. Thus, the current corresponding to the signal characteristic of the preset electrical signals corresponding to that statistical feature mode, the larger the magnitude and the longer the duration of the current to reduce the interference of gas molecules in the vacuum tube 2 with the light.

In some embodiments of the present disclosure, when the statistical characteristics of the optical power of the light passing through the vacuum tube are different, the microprocessor may generate the corresponding electrical signal and send the electrical signal to the energy supply unit, which responds to the electrical signal and the applies current to the semiconductor refrigeration sheet in the corresponding current mode, realizing real-time adjustment of the cooling effect of the semiconductor refrigeration sheet. When the refrigeration effect needs to be strengthened, the output of the energy supply unit is increased in time to reduce the temperature inside the vacuum tube and improve the quality of the transmission of the light source signal. When a high refrigeration effect is not needed, the output of the energy supply unit is reduced in time, conserving resources, and improving the service life of the semiconductor refrigeration sheet.

The above is only a preferred embodiment of the present invention, and is not intended to limit the present invention, and any modifications, equivalent substitutions, and improvements within the spirit and principles of the present invention shall be included within the scope of protection of the present invention.

The basic concept has been described above. Obviously, for those skilled in the art, the above detailed disclosure is only an example, and does not constitute a limitation to the present disclosure. Although not expressly stated here, those skilled in the art may make various modifications, improvements and corrections to the present disclosure. Such modifications, improvements and corrections are suggested in this disclosure, so such modifications, improvements and corrections still belong to the spirit and scope of the exemplary embodiments of the present disclosure.

Meanwhile, the present disclosure uses specific words to describe the embodiments of the present disclosure. For example, "one embodiment," "an embodiment," and/or "some embodiments" refer to a certain feature, structure or characteristic related to at least one embodiment of the present disclosure. Therefore, it should be emphasized and noted that references to "one embodiment" or "an embodiment" or "an alternative embodiment" two or more times in different places in the present disclosure do not necessarily refer to the same embodiment. In addition, certain features, structures or characteristics in one or more embodiments of the present disclosure may be properly combined.

In addition, unless clearly stated in the claims, the sequence of processing elements and sequences described in the present disclosure, the use of counts and letters, or the use of other names are not used to limit the sequence of processes and methods in the present disclosure. While the foregoing disclosure has discussed by way of various examples some embodiments of the invention that are presently believed to be useful, it should be understood that such detail is for illustrative purposes only and that the appended claims are not limited to the disclosed embodiments, but rather, the claims are intended to cover all modifications and equivalent combinations that fall within the spirit and scope of the embodiments of the present disclosure. For example, although the implementation of various components described above may be embodied in a hardware device, it may also be implemented as a software only solution, e.g., an installation on an existing server or mobile device.

In the same way, it should be noted that in order to simplify the expression disclosed in this disclosure and help the understanding of one or more embodiments of the invention, in the foregoing description of the embodiments of the present disclosure, sometimes multiple features are combined into one embodiment, drawings or descriptions thereof. This method of disclosure does not, however, imply that the subject matter of the disclosure requires more features than are recited in the claims. Rather, claimed subject matter may lie in less than all features of a single foregoing disclosed embodiment.

In some embodiments, counts describing the quantity of components and attributes are used. It should be understood that such counts used in the description of the embodiments use the modifiers "about," "approximately" or "substantially" in some examples. Unless otherwise stated, "about," "approximately" or "substantially" indicates that the stated figure allows for a variation of ±20%. Accordingly, in some embodiments, the numerical parameters used in the disclosure and claims are approximations that can vary depending upon the desired characteristics of individual embodiments. In some embodiments, numerical parameters should consider the specified significant digits and adopt the general digit retention method. Although the numerical ranges and parameters used in some embodiments of the present disclosure to confirm the breadth of the range are approximations, in specific embodiments, such numerical values are set as precisely as practicable.

Each of the patents, patent applications, publications of patent applications, and other material, such as articles, books, specifications, publications, documents, things, and/or the like, referenced herein is hereby incorporated herein by this reference in its entirety for all purposes, excepting any prosecution file history associated with same, any of same that is inconsistent with or in conflict with the present document, or any of same that may have a limiting affect as to the broadest scope of the claims now or later associated with the present document. By way of example, should there be any inconsistency or conflict between the description, definition, and/or the use of a term associated with any of the incorporated material and that associated with the present document, the description, definition, and/or the use of the term in the present document shall prevail.

In closing, it is to be understood that the embodiments of the application disclosed herein are illustrative of the principles of the embodiments of the application. Other modifications that may be employed may be within the scope of the application. Thus, by way of example, but not of limitation, alternative configurations of the embodiments of the application may be utilized in accordance with the teachings herein. Accordingly, embodiments of the present application are not limited to that precisely as shown and described.

What is claimed is:

1. A ceramic package for quantum computing, comprising a first light window, a first ceramic plate, a vacuum tube, a second ceramic plate, and a second light window connected sequentially from bottom to top, wherein the first light window is installed on the first ceramic plate, the second light window is installed on the second ceramic plate, and the vacuum tube has a signal inlet and a signal outlet, the first light window and the second light window cover the signal inlet and the signal outlet of the vacuum tube, respectively; a side of the first ceramic plate is provided with a lead wire, wherein the side is opposite to other side of the first ceramic plate connected with the vacuum tube and the lead wire configured to lead a signal into a system;

the first ceramic plate is provided with a first through hole in a middle of the first ceramic plate, the second ceramic plate is provided with a second through hole in a middle of the second ceramic plate, the first light window covers the first through hole, the second light window covers the second through hole, the first through hole, the vacuum tube, and the second through hole are coaxially arranged;

the vacuum tube and the first ceramic plate are connected by a first solder sheet, and the vacuum tube and the second ceramic plate are connected by another first solder sheet; the first light window and the first through hole are connected by a second solder sheet, and the second light window and the second through hole are connected by another second solder;

the first ceramic plate and the second ceramic plate are both aluminum nitride ceramic plates;

the first solder sheet is a silver-copper solder sheet and the second solder sheet is a gold-tin solder sheet; and a size of the first ceramic plate is larger than a size of the second ceramic plate.

2. The ceramic package for quantum computing of claim 1, wherein the outer surface of the ceramic package is further plated with a nickel layer and a gold layer, in that order; a welding surface of the first light window and a welding surface of the second light window are plated with the gold layer, wherein the welding surface of the first light window is a surface formed when the first light window and the first ceramic plate are welded together, and the welding surface of the second light window is a surface formed when the second light window and the second ceramic plate are welded together; the first light window and the second light window have a photon signal passage respectively, and the photon signal passage of the first light window and the photon signal passage of the second light window comprise a plating layer on the first light window and the second light window respectively.

3. A method for preparing the ceramic package for quantum computing of claim 1, comprising:
- in S1, placing the first ceramic plate, the vacuum tube, the second ceramic plate, the lead wire, and the first solder sheets in a mold for positioning, and soldering the solder sheets into a sintered member by heating and melting the solder sheets;
- in S2, plating nickel and gold on an outer surface of the sintered member, respectively;
- in S3, providing a gold layer on a welding surface of the first and second light windows and a plating layer on a photon signal passage of each of the first and second light windows; and
- in S4, connecting the nickel-plated and a gold-plated sintered member with the first light window and the second light window through gold-tin soldering by the second solder sheets, respectively, to form a ceramic package with a vacuum channel.

4. The method for preparing the ceramic package for quantum computing of claim 3, wherein the operation S3 is accomplished via a vacuum furnace.

5. The method for preparing the ceramic package for quantum computing of claim 3, wherein a vacuum degree within the vacuum channel in the operation S4 is less than 100 [pa] pascals (Pa).

* * * * *